United States Patent
Deak

(10) Patent No.: US 6,570,783 B1
(45) Date of Patent: May 27, 2003

(54) ASYMMETRIC MRAM CELL AND BIT DESIGN FOR IMPROVING BIT YIELD

(75) Inventor: James G. Deak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/094,971

(22) Filed: Mar. 12, 2002

Related U.S. Application Data

(60) Provisional application No. 60/331,421, filed on Nov. 15, 2001.

(51) Int. Cl.$^7$ ................................................ G11C 11/00
(52) U.S. Cl. ....................................... 365/158; 365/171
(58) Field of Search ................................ 365/158, 171, 365/173, 145, 172

(56) References Cited

U.S. PATENT DOCUMENTS

| | | | |
|---|---|---|---|
| 5,982,658 A | 11/1999 | Berg et al. | |
| 6,005,800 A | 12/1999 | Koch et al. | |
| 6,072,717 A | 6/2000 | Brug et al. | |
| 6,072,718 A | * 6/2000 | Abraham et al. | 365/158 |
| 6,081,445 A | 6/2000 | Shi et al. | |
| 6,097,626 A | 8/2000 | Brug et al. | |
| 6,104,633 A | 8/2000 | Abraham et al. | |
| 6,134,139 A | 10/2000 | Bhattacharyya et al. | |
| 6,252,795 B1 | * 6/2001 | Hansen et al. | 365/158 |
| 6,385,082 B1 | * 5/2002 | Abraham et al. | 365/145 |

\* cited by examiner

*Primary Examiner*—Richard Elms
*Assistant Examiner*—Anh Phung
(74) *Attorney, Agent, or Firm*—Dickstein Shapiro Morin Oshinsky LLP

(57) ABSTRACT

An asymmetric cell and bit design for an MRAM device. The design is asymmetrical with respect to the easy-axis of the cell and has a centroid displaced from bit center along the hard-axis of the cell. This asymmetry is large enough so that manufacturing process variations do not substantially change the switching fields of the bits. In addition, the asymmetry causes the ends of the bits to align in opposite directions in small half-select fields and parallel to each other at large half-select fields, which increases the difference in the switching fields between selected and unselected bits. The combined effect of these two characteristics results in increased bit yield (relative to similarly sized symmetric bits) due to a smaller overlap between selected and unselected bit switching distributions.

25 Claims, 11 Drawing Sheets

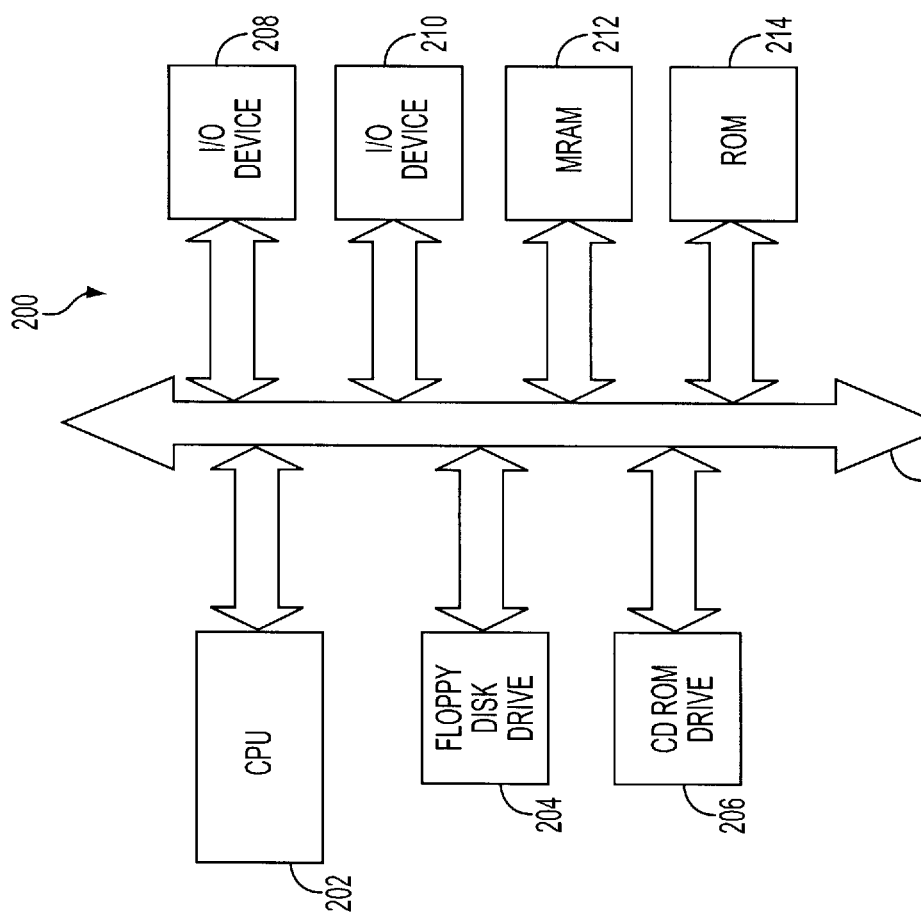

ASYMMETRIC MRAM CELL AND BIT DESIGN FOR IMPROVING BIT YIELD

This application claims the benefit of U.S. Provisional Patent Application No. 60/331,421, filed on Nov. 15, 2001, the entire contents of which are incorporated herein by reference.

FIELD OF THE INVENTION

The present invention relates generally to memory devices and, more particularly, to an asymmetric cell and bit design for improving the bit yield of a magnetoresistive random access memory (MRAM) device.

BACKGROUND OF THE INVENTION

Integrated circuit designers have always sought the ideal semiconductor memory: a device that is randomly accessible, can be written or read very quickly, is non-volatile, but indefinitely alterable, and consumes little power. MRAM technology has been increasingly viewed as offering all these advantages.

An MRAM device typically includes an array of magnetic memory cells. A typical magnetic memory cell has a structure which includes magnetic layers separated by a non-magnetic layer. Magnetic vectors in one magnetic layer, typically referred to as the pinned layer, are magnetically fixed or pinned in one direction. The magnetic vectors of the other magnetic layer, often referred to as the storage or sense layer, are not fixed so that its magnetization direction is free to switch between "parallel" and "anti-parallel" states relative to the pinned layer. In response to the parallel state, the magnetic memory cell will have a low resistance state. Conversely and in response to the anti-parallel state, the magnetic memory cell will have a high resistance state. The MRAM device associates these two resistance states with either a logical "1" or a "0" bit value.

A logical "1" or "0" is usually written into the magnetic memory cell by applying external magnetic fields (via an electrical current) that rotate the magnetization direction in the storage layer. Typically, the orientation of magnetization in the storage layer aligns along an axis known as the easy-axis. The external magnetic fields are applied to flip the orientation of magnetization in the storage layer along its easy-axis to either the parallel or anti-parallel orientation with respect to the orientation of magnetization in the pinned layer depending on the desired logic state.

MRAM devices usually include an array of row lines and column lines that are used to apply the external magnetic fields to the magnetic memory cells during writing. The magnetic memory cells are usually located at intersections of the row lines and column lines. A selected magnetic memory cell is usually written by applying electrical currents to the particular row and column lines that intersect at the selected magnetic memory cell.

FIG. 1 illustrates a portion of an array 10 of magnetic memory cells 11 found in the typical MRAM device. The cells 11 are arranged into rows and columns with each row having an associated row line 12 and each column having an associated column line 14. In addition, the cells 11 are arranged with their long axis extending parallel to the row lines 12 and their transverse axis extending parallel to the column lines 14. Referring to FIGS. 1 and 2*a*, each cell 11 has an easy-axis 19 of magnetization directed parallel with the long axis (length) of the cell and a hard-axis 20 of magnetization directed parallel with the short axis (width) of the cell. Each cell 11 has a column line 14 that generates an easy-axis magnetic field when current is applied through it and a row line 12 that generates a hard-axis magnetic field when current is applied through it. The manner in which currents generate magnetic fields in magnetic memory devices is well known in the art and is not discussed herein.

The magnetic field aligned to the easy-axis is referred to herein as the easy-axis write field while the other field is referred to as the hard-axis write field. It is desired that only the selected magnetic memory cell receives both the easy-axis and hard-axis write fields. Each write field is commonly referred to as a half-select field because individually they cannot switch the contents of cell. In practice, however, the hard-axis write field is usually referred to as the half-select field, while the easy-axis write field is referred to as the switching field.

The bit stored in the selected memory cell is referred to herein as a "selected bit." AR of the remaining memory cells coupled to the column line or row line, which are not the desired selected cell are referred to herein as "unselected cells" and their corresponding bits are "unselected bits." The unselected cells coupled to the particular column line usually receive only the easy-axis write field. Similarly, the unselected cells coupled to the particular row line usually receive only the hard-axis write field. The magnitudes of the easy-axis and hard-axis write fields are usually chosen to be high enough so that the stored bit in the selected magnetic memory cell switches its logic state, but are low enough so that the stored bits in the unselected memory cells, that are subject to only one of the write fields, do not switch. An undesirable switching of a stored bit in an unselected magnetic memory cell (i.e., one that receives only one of the write fields) is commonly referred to as half-select switching.

A serious problem that needs to be overcome in order to build reliable MRAM devices is the distribution of the switching fields that occur in the selected and unselected bits. A distribution of selected or unselected write fields strongly degrades bit yield. This is due to an overlap in the distribution of the write currents between the selected and unselected bits. It has been determined that this problem is attributable in part to the shape of the memory cells.

Referring again to FIG. 2*a* and as discussed above, the typical memory cell 11 has multiple layers of magnetoresistive material. For example, the illustrated cell 11 includes a first magnetic layer 16 and a second magnetic layer 17, which are separated by a first conducting or insulating spacer layer 18. The stack of magnetic and non-magnetic layers are often patterned into symmetrical shape such as an ellipse, rectangle or hexagon. FIG. 2*a* illustrates a memory cell 11 with a rectangular shape. In the illustrated rectangular cell 11, the layers 16 and 17 have a magnetization vector 21 that is positioned substantially along the length or easy-axis of the cell 11. The vector 21 is depicted with an arrowhead at each end to represent the two different magnetization directions within the cell 11. As discussed above, the magnetization in one of the layers 16/17 is generally pinned while the magnetization of the other layer 17/16 is free to rotate into either of the two positions represented by the vector 21.

The problem with the shape of the current magnetic memory cell (i.e., ellipse, rectangle, hexagon) is that they are perfectly symmetrical. Any slight deviation from the perfectly symmetrical shape due to, for example, manufacturing process variations can cause a significant change in the magnetic fields and currents required to write a bit into the cells increasing the distribution of write currents within the array. This decreases write margin (i.e., the difference between the write currents of selected and unselected bits), which reduces bit yield.

Accordingly, there is a desire and need for a cell and bit design that increases the write margin and bit yield in an MRAM device.

SUMMARY OF THE INVENTION

The present invention provides a design for memory cells of an MRAM device that increases the write margin and bit yield of the MRAM device.

The above and other features and advantages are achieved by providing an asymmetric cell and bit design, rather than a symmetric design, for an MRAM device. The design is asymmetric when reflected about the easy-axis and has a centroid that is displaced from the bit center along the hard-axis. This asymmetry is large enough so that manufacturing process variations do not substantially change the switching fields of the stored bits. In addition, the asymmetry causes the ends of the bits to align in opposite directions in small half-select fields and parallel to each other at large half-select fields, which increases the difference in the switching fields between selected and unselected bits. The combined effect of these two characteristics results in increased bit yield (relative to similarly sized symmetric cells and bits) due to a smaller overlap between selected and unselected bit switching distributions.

BRIEF DESCRIPTION OF THE DRAWINGS

The foregoing and other advantages and features of the invention will become more apparent from the detailed description of exemplary embodiments provided below with reference to the accompanying drawings in which:

FIG. 11 illustrates a processor system incorporating an MRAM memory circuit constructed in accordance with an exemplary embodiment of the invention.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

As noted above, a fundamental problem that needs to be overcome in any MRAM device is the distribution of switching fields that results in poor bit yield due to an overlap between the write current distributions of selected and unselected bits. It has been determined that there are various parameters intrinsic to the MRAM cell/bit that could affect the selected and unselected bit distribution overlap. These include, but are not limited to random variations in bit shape from bit to bit, random variations in material parameters from bit to bit, the sequence of fields by which the bit is written, the value of the fields used to write a bit, and magnetic noise.

A major contributor to the width of the switching field distributions relates to the magnetization reversal mode. The magnetization reversal mode can be defined as the sequence of magnetization patterns during the magnetization reversal process (i.e., the switching of the magnetization direction of vector 21 illustrated in FIG. 2a). These magnetization patterns can be selected by bit shape and by different combinations of the write fields. The term "bit shape" is used throughout the remainder of this specification, but it should be appreciated that bit shape results from the shape of the memory cell storing the bit. Thus, for example, a reference to a symmetrical bit shape should also be deemed as referring to a symmetrical memory cell.

It has been determined that if properly selected, the bit shape and write fields used to write the bit can be used to increase the distance between the mean of the selected and unselected write field distributions (i.e., increase the write margin) and to decrease the width of the write field distributions by locking in a preferred reversal mode.

Figure 1:
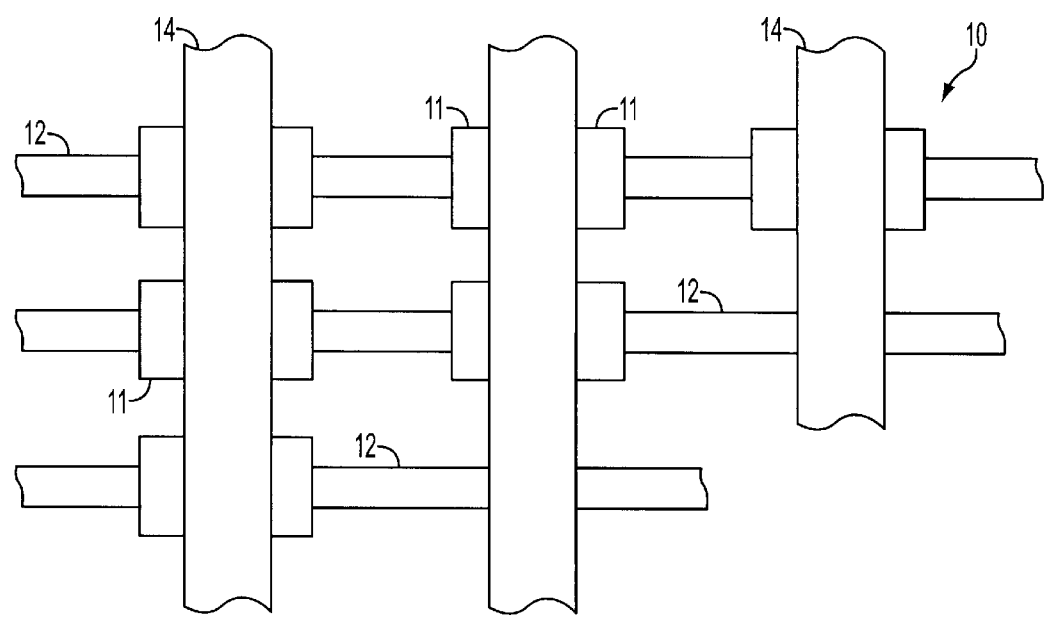
FIG. 1 illustrates a portion of an array of magnetic memory cells in an MRAM device.
Figure 2A:
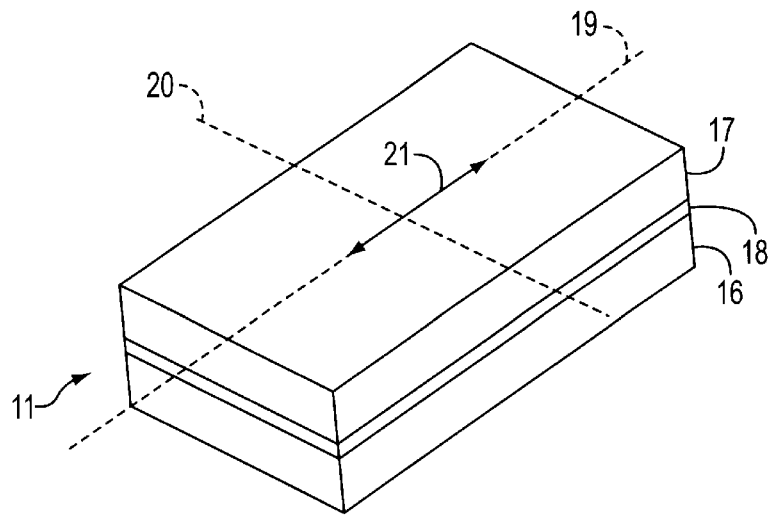
FIG. 2a illustrates a simplified view of a memory cell in the array illustrated in FIG. 1.
Figure 2B:
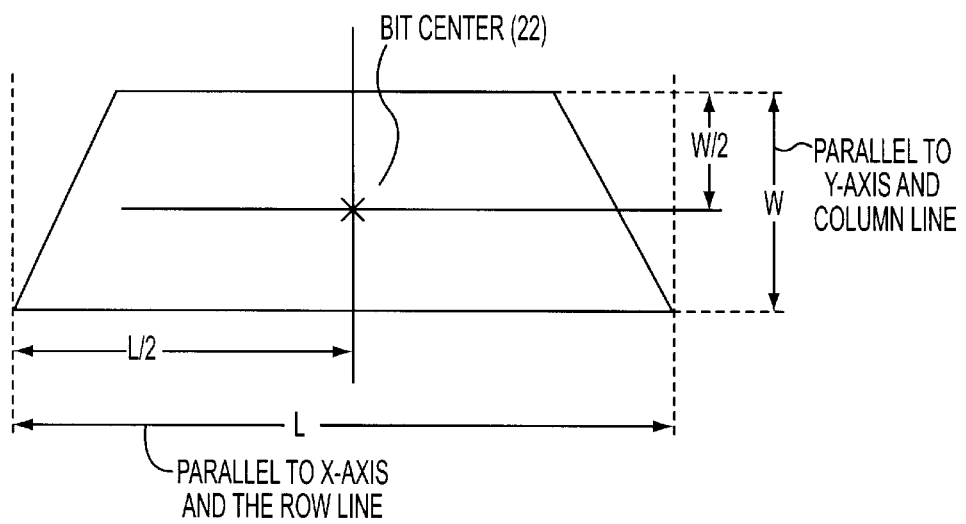
FIG. 2b illustrates a bit center and coordinate system for defining bit symmetry/asymmetry.

Bit shape and corresponding symmetry/asymmetry can be quantified using the bit centroid and rotation with respect to the coordinate system illustrated in FIG. 2b. The x-axis is parallel to the row line and the y-axis is parallel to the column line. The length of the bit is measured along the x-axis and the width is measured along the y-axis. The coordinate system used for defining bit symmetry/asymmetry is centered at 22 as shown in FIG. 2b.

The x and y coordinates of a bit's centroid are defined as follows:

$$<x> = \int\int x\,dx\,dy / \int\int dx\,dy; \text{ and} \quad (1)$$

$$<y> = \int\int y\,dx\,dy / \int\int dx\,dy. \quad (2)$$

The bit rotation is defined as:

$$<\theta> = \int\int \theta(x,y)\,dx\,dy / \int\int dx\,dy. \quad (3)$$

Using these definitions, bit symmetry/asymmetry is defined as follow:

$$<x>=0; \ <y>=0; \ <\theta>=0 \rightarrow \text{symmetric}; \quad (4)$$

$$<x>=0; \ <y>=0; \ <\theta>\neq 0 \rightarrow \text{rotated; and} \quad (5)$$

$$<x>=0; \ <y>\neq 0; \ <\theta>=0 \rightarrow \text{lopsided with respect to the hard-axis}$$
(i.e., the centroid is displaced from the bit's center along the hard-axis). \quad (6)

Figure 3A:
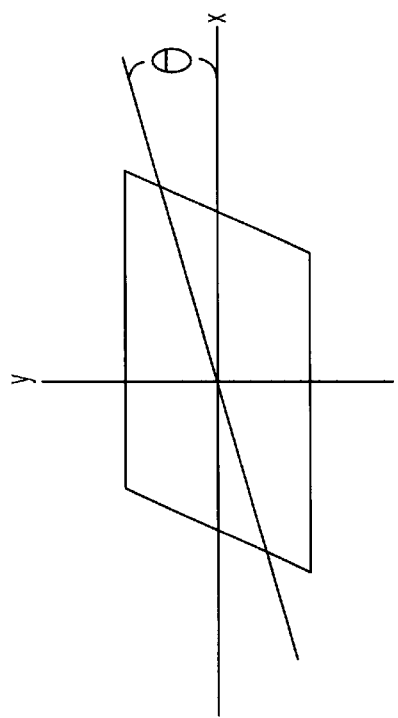
FIGS. 3a–3c illustrate exemplary bit shapes that can be used in an MRAM device.
Figure 3B:
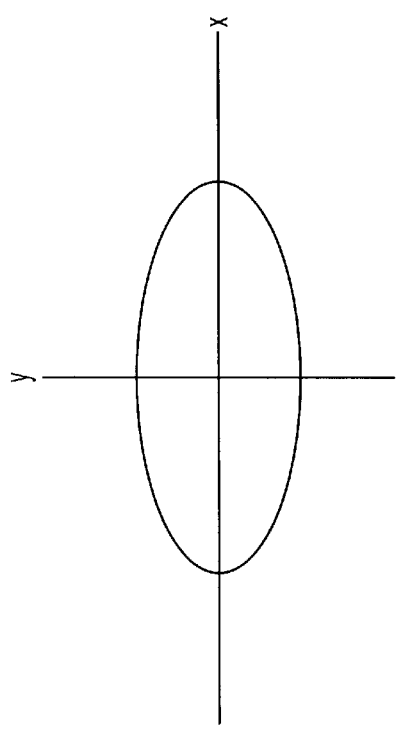
Figure 3C:
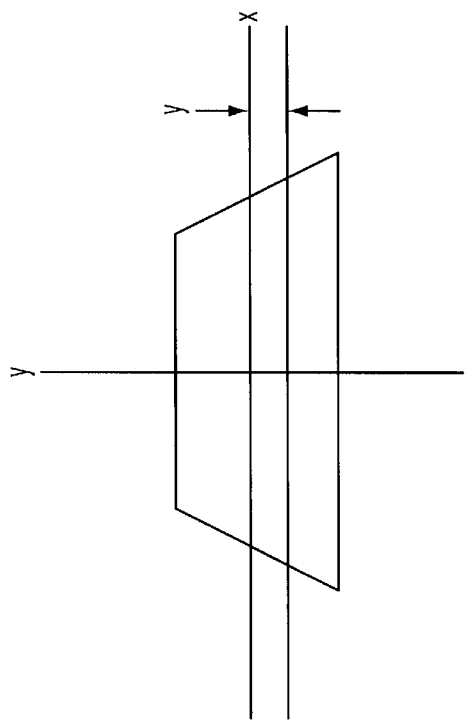

FIG. 3a illustrates a symmetrical ellipse-shaped bit corresponding to equation (4). FIG. 3b illustrates a rotated parallelogram-shaped bit corresponding to equation (5). FIG. 3c illustrates a bit shape that is asymmetrical with a centroid that is displaced from the bit center along the hard-axis (y) that corresponds to equation (6). In FIGS. 3a–3c, the x-axis is the easy-axis while the y-axis is the hard-axis.

Figure 4B:
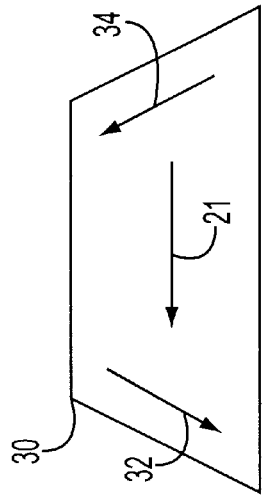
FIGS. 4a–4d illustrate different magnetization patterns for a bit shape that is asymmetrical and has a centroid displaced from the bit center along the hard-axis.
Figure 4D:
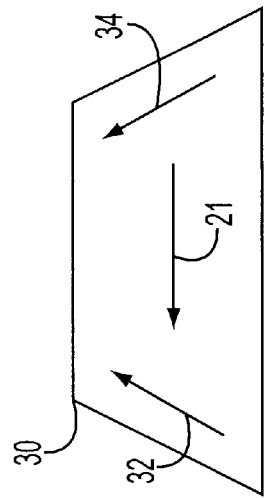
Figure 4A:
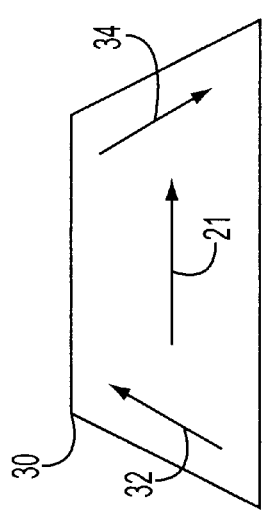
Figure 4C:
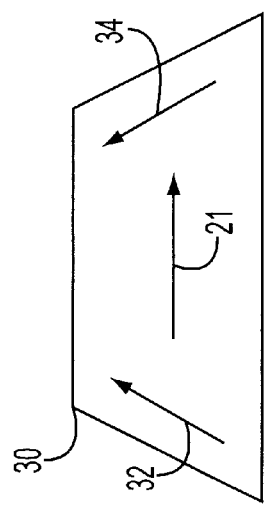

Bit symmetry/asymmetry strongly determines magnetization patterns, since the magnetization prefers to align parallel to the edges of the bit. FIGS. 4a–4d illustrate different magnetization patterns for a bit 30 that is asymmetrical and has a centroid displaced along the hard-axis from the bit's center (i.e., $<y>\neq 0$). FIGS. 4a, 4b illustrate the patterns for low hard-axis write fields. With low hard-axis write fields, the magnetization patterns in the ends 32, 34 of the asymmetrical bit 30 align in opposite directions (i.e., vector 32 is point up while vector 34 is pointing down). In FIG. 4a, the magnetization vector 21 is pointing to the right and in FIG. 4b, the vector 21 has been switched or reversed such that it is now pointing to the left. FIGS. 4c, 4d illustrate the patterns for high hard-axis write fields. With high hard-axis write fields, the patterns in the ends 32, 34 of the asymmetrical bit 30 align in the same direction. In FIG. 4c, the magnetization vector 21 is pointing to the right and in FIG. 4d, the vector 21 has been switched or reversed such that it is now pointing to the left. The field required to switch the direction of the magnetization vector 21 is greater when the patterns in the ends 32, 34 are aligned in opposite directions than when they are aligned in the same direction.

Figure 5A:
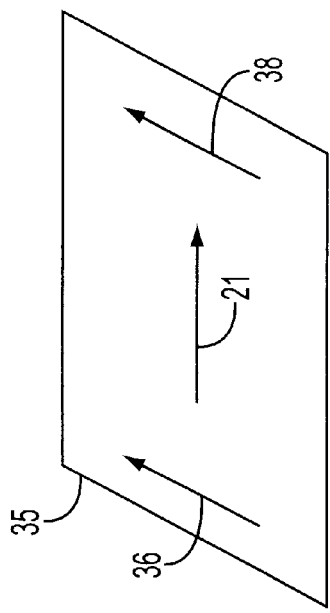
FIGS. 5a–5d illustrate different magnetization patterns for a bit shape that is rotated with respect to the row line.
Figure 5B:
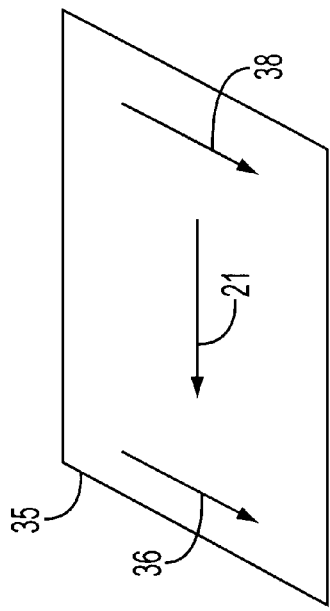
Figure 5C:
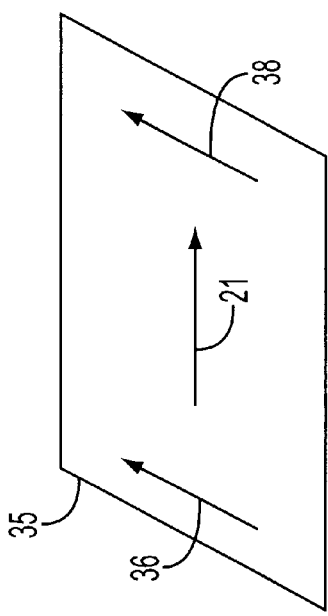
Figure 5D:
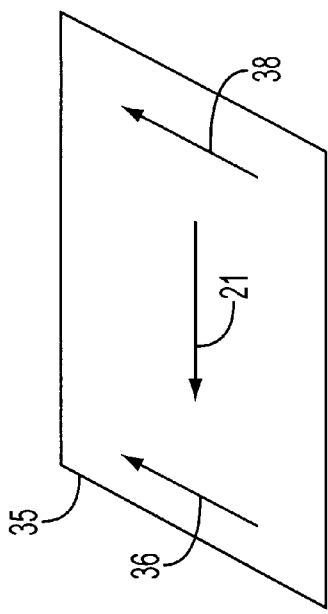

FIGS. 5a–5d illustrate different magnetization patterns for a bit 35 having a shape that is rotated with respect to the x-axis ($<\theta>\neq 0$). FIGS. 5a, 5b illustrate the patterns for low hard-axis write fields. With low hard-axis bias fields, the magnetization patterns in the ends 36, 36 of the bit 35 align in the up direction when the magnetization vector 21 is pointing to the right and in the down direction when the vector 21 has been reversed such that it is pointing to the left. FIGS. 5c, 5d illustrate the patterns for high hard-axis bias fields. With high hard-axis bias fields, the patterns in the ends 36, 38 of the bit 35 align in the same direction and always up. As the hard-axis magnetic write field increases it becomes easier to magnetize the vector 21 to the right than to the left.

Figure 6A:
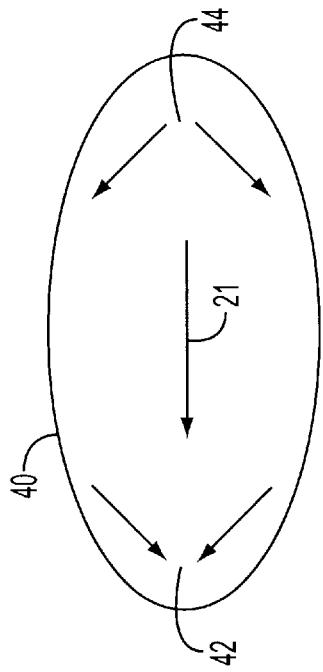
FIGS. 6a–6d illustrate different magnetization patterns for a symmetrical bit shape.
Figure 6B:
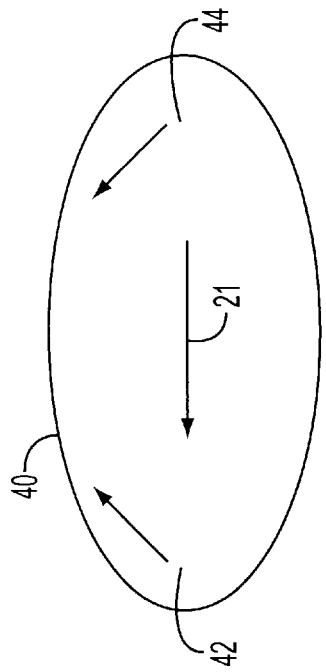
Figure 6C:
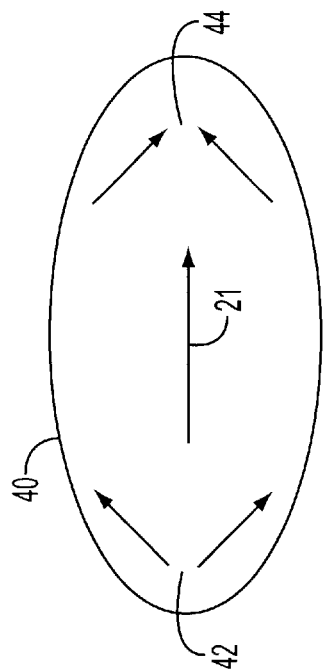
Figure 6D:
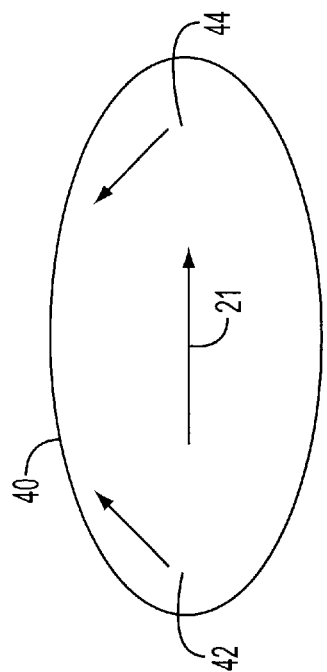

FIGS. 6a–6d illustrate different magnetization patterns for a symmetrical bit 40. FIGS. 6a, 6b illustrate the patterns for low hard-axis bias fields. With low hard-axis bias fields and perfect symmetry, the magnetization patterns in the ends 42, 44 of the bit 40 split (point up and down) so that they align parallel to the bit edge. Slight deviation in bit symmetry, which could result from process variations, will cause the bit to magnetize as illustrated in FIGS. 4 and 5. This will cause a large scatter in the write fields required to reverse the direction of the magnetization vector 21. FIGS. 6c, 6d illustrate the patterns for high hard-axis bias fields. With high hard-axis bias fields, the patterns in the ends 42, 44 of the bit 40 align in the same direction and parallel to the hard-axis bias field.

As shown above with respect to FIGS. 3a–6d, bit symmetry/asymmetry strongly determines magnetization patterns. Four different bit shapes were simulated to determine their magnetization patterns. The shapes are illustrated in FIGS. 7a–7d and are defined as follows:

ellipse=$<x>$=0 nm; $<y>$=0 nm; $<\theta>$=0 degrees; (7)

asym#2=$<x>$=0 nm; $<y>$=−8 nm; $<\theta>$=0 degrees; (8)

asym#3=$<x>$=0 nm; $<y>$=−4 nm; $<\theta>$=0 degrees; and (9)

asym#4=$<x>$=0 nm; $<y>$=0 nm; $<\theta>$=−15 degrees. (10)

Figure 7B:
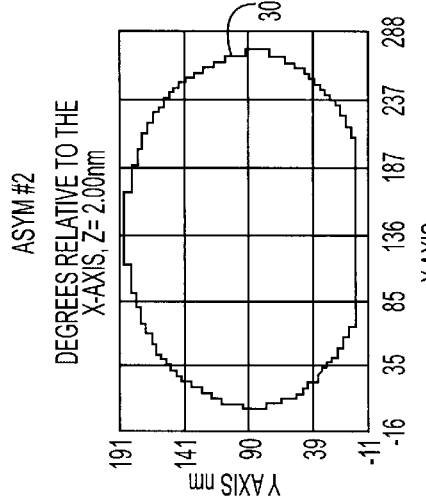
FIGS. 7a–7d illustrate exemplary bit shapes used in an MRAM device.
Figure 7D:
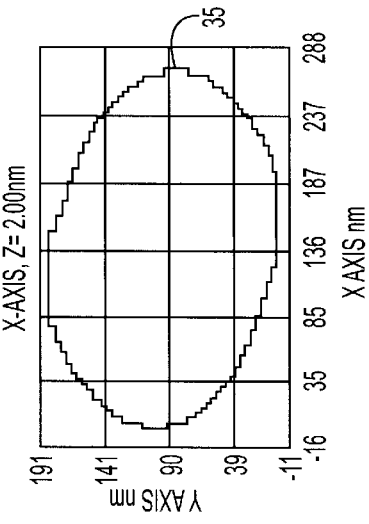
Figure 7A:
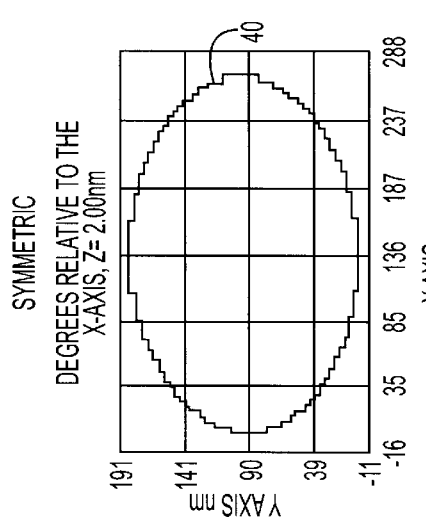
Figure 7C:
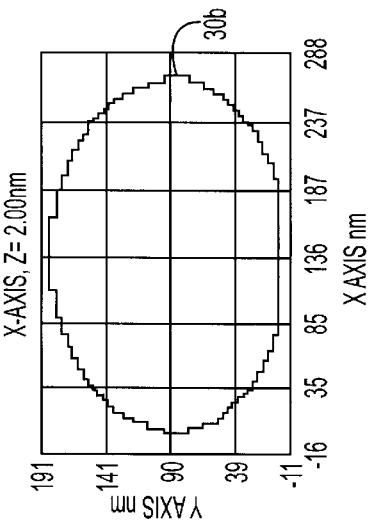

All bits in the simulation are nominally 270 nm long, by 180 nm wide and 4 nm thick ellipses. FIG. 7a illustrates the symmetrical ellipse 40 corresponding to equation (7). FIG. 7b illustrates a first asymmetrical bit 30a that has a centroid that is displaced from the center along the hard-axis (i.e., y-axis) and corresponds to equation (8). FIG. 7c illustrates a second asymmetrical bit 30b that has a centroid displaced along its hard-axis (i.e., y-axis) from the bit center and corresponds to equation (9). FIG. 7d illustrates a third ellipse that is rotated with respect to its easy-axis (i.e., x-axis) and corresponds to equation (10).

Figure 8:
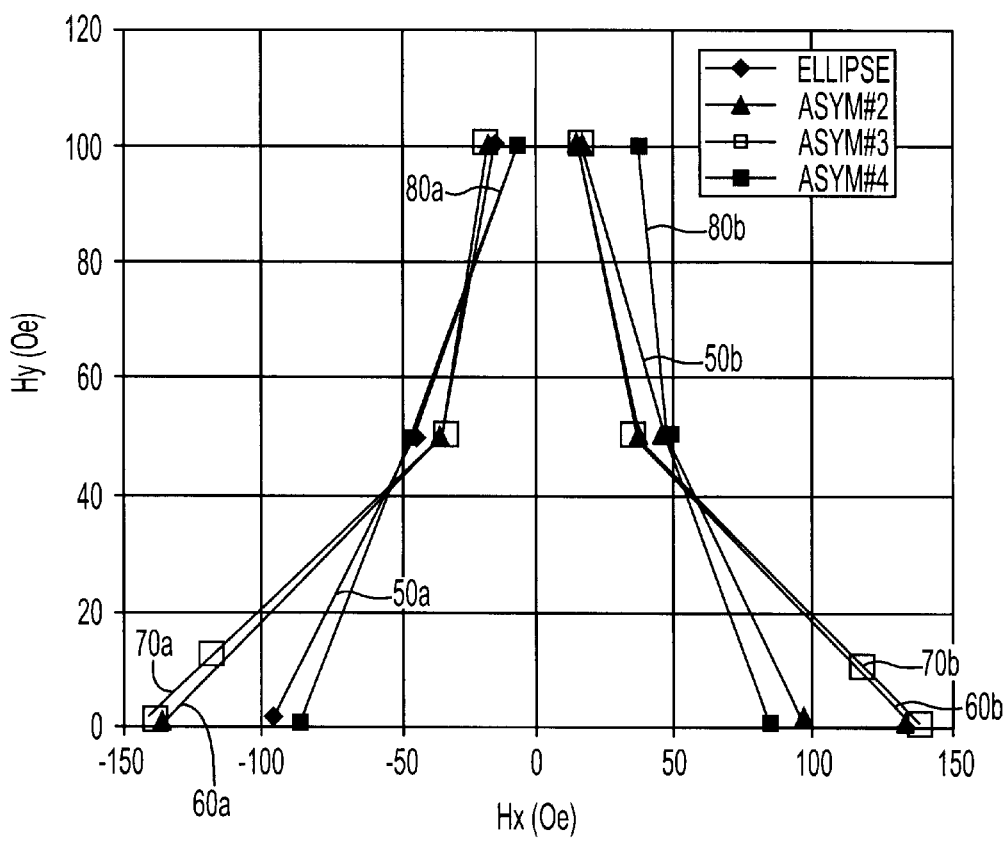
FIG. 8 is a simulation of the switching astroids of the bit shapes shown in FIGS. 7a–7d.

FIG. 8 shows the effects of changes in bit symmetry on the mean magnetic field required to write a bit. There are four curves with each curve comprised of two lines on the graph. Each curve represents the bits illustrated in FIGS. 7a–7d. The curve for the ellipse corresponds to the first and second lines 50a, 50b, the curve for asym#2 corresponds to the third and fourth lines 60a, 60b, the curve for asym#3 corresponds to the fifth and sixth lines 70a, 70b and the curve for asym#4 corresponds to the seventh and eighth lines 80a, 80b.

The axes for the graph are the hard-axis write field (Hy) and the easy-axis write fields (Hx). That is, Hy is the half-select field, and Hx is the switching field. The units for the fields in the graph are oersted (Oe). The curves represented by lines 50a, 50b, 60a, 60b, 70a, 70b, 80a, 80b are usually referred to as switching astroids. The memory cell operating points are represented by Hx, Hy pairs. If the operating point is between the two lines of the curve (i.e., inside the astroid), a bit cannot be written into the cell. If, however, the operating point is on the outer left or right of the two lines of the curve (e.g., outside the astroid), the bit can be written into the cell.

The subtle differences in bit shape illustrated in FIGS. 7a–7d cause significant variations in the switching field at fixed values of the half-select field, as indicated by the different curves shown in FIG. 8. From FIG. 8, it is apparent that when a bit has an asymmetry characterized by a centroid displaced along the y-axis (illustrated by the asym#2 and asym#3 curves), it shows a stronger drop in Hx with increasing Hy and would thus be preferred in terms of improving bit yield. Thus, the present invention uses asymmetric bit shapes that have a centroid displaced from the bit center along the hard-axis to overcome one of the major problems with the prior art MRAM cells.

It should be noted that the present invention also encompasses the effects of material parameter variation as well as dimensional variation. Had material parameter variation and/or dimensional variation been introduced into the above example, the switching field distribution at fixed values of Hy would be larger than those shown in FIG. 8. As noted above, increasing the difference in Hx between the unselected and selected states (Hy=0 and Hy$\neq$0) improves bit yield. The bit shape characterized by equation (6) would have this effect.

Figure 9B:
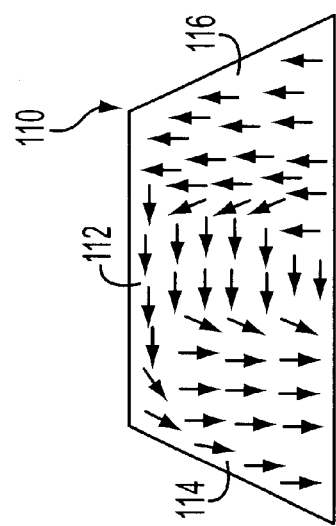
FIGS. 9a–9c. illustrate an example reversal mode for an asymmetric bit shape with a centroid that is displaced from bit center along the hard-axis with a small hard-axis bias.
Figure 9C:
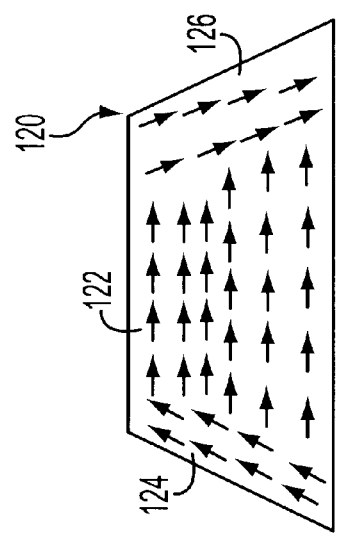
Figure 9A:
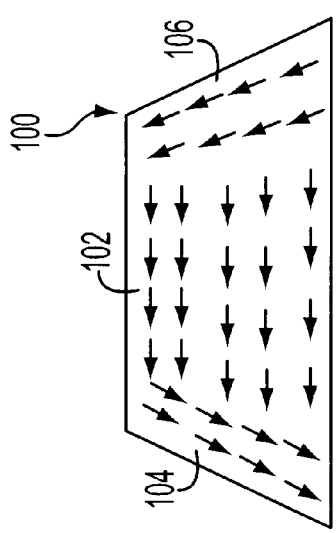

Two exemplary switching modes are illustrated in FIGS. 9a–9c and 10a–10c. FIGS. 9a–9c illustrate the switching mode that tends to occur in asymmetric bits characterized by $<y>\neq 0$ (i.e., the centroid is displaced from center along the hard-axis) and at values of Hy below a threshold value. FIG. 9a illustrates a first magnetization pattern 100 in which it main magnetization 102 is pointing to the left. An end region 104 has a magnetization direction pointing down while a second end region 106 has a magnetization direction pointing up. FIG. 9b illustrates an intermediate magnetization pattern 110 that consists of a main magnetization portion 112 with its direction pointing to the left. The first end region 114 has a magnetization direction pointing down while a second end region 116 has a magnetization direction pointing up. FIG. 9c illustrates a magnetization pattern 120 after the reversal. The pattern 120 comprises a portion 122 with a magnetization direction pointing to the right, an end region 124 has a magnetization direction pointing up while a second end region 126 has a magnetization direction pointing down. This switching mode occurs because it is energetically favorable for the ends of these bits to align in opposite directions and thus, they tend to form a domain wall (e.g., regions 114, 116) as the Hx is increased (FIG. 9b).

Figure 10B:
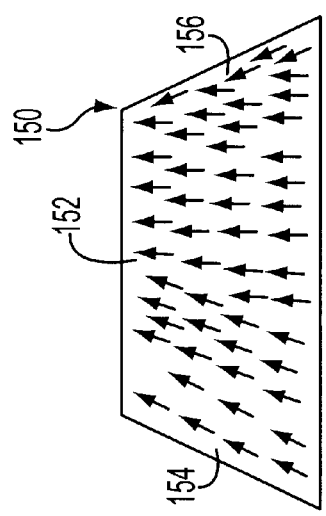
FIGS. 10a–10c. illustrate an example reversal mode for an asymmetric bit shape with a centroid displaced along the hard-axis from the bit center with a large hard-axis bias.
Figure 10C:
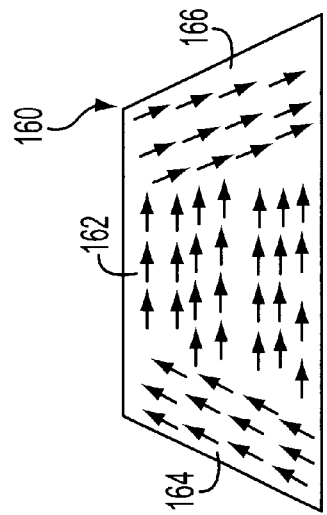
Figure 10A:
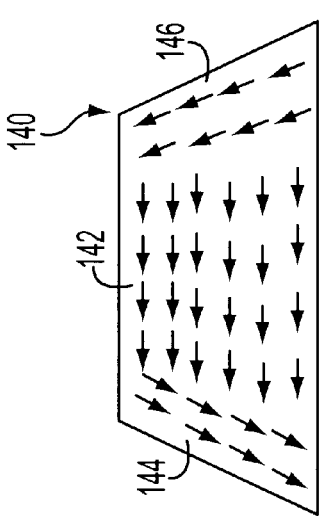

FIGS. 10a–10c illustrate the mode that occurs in asymmetric bits characterized by $<y>\neq 0$ (i.e., centroid displaced from bit center along the hard-axis) but at high bias values of Hy (i.e., above a certain threshold value). FIG. 10a illustrates a magnetization pattern 140 in which it main magnetization 142 is pointing to the left while its end regions 144, 146 have a magnetization that are pointing down and up, respectively. FIG. 10b illustrates an intermediate magnetization pattern 150 after both Hx and Hy have been turned on that consists of a main magnetization portion 152 with its direction pointing up, and left and right end regions 154, 156 also pointing up. FIG. 10c illustrates a magnetization pattern 160 after the reversal and after Hy is set to zero. The pattern 160 comprises a main magnetization region 162 pointing to the right, and end regions 164, 166 having magnetization directions pointing up and down, respectively. A shape such as $<y>\neq 0$ asymmetry that exhibits this mode change with increasing Hy is highly desirable since it increases write margin due to the difference in switching fields between the reversal modes illustrated in FIGS. 9 and 10.

Thus, simulations of the lopsided asymmetrical bits (asym#2 and asym#3 illustrated in FIGS. 7b, 7c) tend to show that it is possible to design a bit that changes its magnetization reversal mode upon application of Hy and thus shows an improved write margin over that of a symmetric bit. Secondly, it is possible to design the $<y>\neq 0$ asymmetry so that it is just large enough to overwhelm any changes in symmetry that may result due to processing variation. This would lock in a reversal mode and narrow the distribution of switching fields by eliminating modes with different switching astroids. FIG. 8 illustrates that although bits asym#2 and asym#3 have slightly different shapes, their astroids nearly identical.

It should be noted that the cells with the asymmetric bit shapes such that the centroid is displaced from the bit center along the hard-axis can be manufactured by any processing method or technique and that the invention is not to be limited to any such method. Moreover, the layers (e.g., layers 16–18 illustrated in FIG. 2a) that make up the cells are not limited to any specific material or layers of materials. All that is required is the ability to form cells with the desired shape. The layers 16–18 illustrated in FIG. 2a are suitable to practice the invention as long as they are patterned into the asymmetrical shape with the centroid displaced from the bit center along the hard-axis. It should also be appreciated that only the storage layer 17 needs to have a shape with its centroid displaced from the bit center along the hard-axis to practice the invention. That is, if it is desirable to have a symmetrical pinned layer 16 and non-magnetic layer 18, then the invention could still be practiced solely by shaping the storage layer 17 with its centroid displaced from the bit center along the hard-axis.

FIG. 11 illustrates a processor system 200 incorporating an MRAM memory circuit 212 constructed in accordance with an embodiment of the invention. That is, the MRAM memory circuit 212 comprises an array of magnetic memory cells that are asymmetrical and have a centroid displaced from bit center along the hard-axis and thus, have improved bit yield as explained above with respect to FIGS. 3b, 4a–4d, 8 and 9a–9c. The system 200 may be a computer system, a process control system or any other system employing a processor and associated memory.

The system 200 includes a central processing unit (CPU) 202, e.g., a microprocessor, that communicates with the memory circuit 212 and an I/O device 208 over a bus 220. It must be noted that the bus 220 may be a series of buses and bridges commonly used in a processor system, but for convenience purposes only, the bus 220 has been illustrated as a single bus. A second I/O device 210 is illustrated, but is not necessary to practice the invention. The system 200 may also include additional memory devices such as a read-only memory (ROM) device 214, and peripheral devices such as a floppy disk drive 204 and a compact disk (CD) ROM drive 206 that also communicates with the CPU 202 over the bus 220 as is well known in the art. It should be noted that the memory 212 may be embedded on the same chip as the CPU 202 if so desired.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A magnetic memory cell comprising:
   a first magnetic layer having a pinned magnetization direction;
   a second magnetic layer having a switchable magnetization direction; and
   a non-magnetic layer between said first and second magnetic layers,
   wherein said cell comprises a hard-axis and an easy-axis, an intersection of the hard-axis and easy-axis defining a center of said cell, and at least said second magnetic layer has a centroid that is displaced along the hard-axis from the center.

2. The magnetic memory cell of claim 1 wherein said second magnetic layer is patterned into a lopsided shape with its centroid displaced along the hard-axis from the center.

3. The magnetic memory cell of claim 1 wherein each of said layers has an associated centroid that is displaced from the center along the hard-axis.

4. The magnetic memory cell of claim 1 wherein each of said layers has an associated centroid and is patterned into a lopsided shape with its respective centroid displaced along the hard-axis from the center.

5. The magnetic memory cell of claim 1 wherein said second magnetic layer comprises first and second end regions and a main region, said main region being parallel to said easy-axis and stores the magnetization that is switchable between the first and second directions, and said first and second ends store magnetic fields that align in opposite directions with respect to each other when low half-select fields are applied to the cell.

6. The magnetic memory cell of claim 1 wherein said second magnetic layer comprises first and second end regions and a main region, said main region being parallel to said easy-axis and stores the magnetization that is switchable between the first and second directions, and said first and second ends store magnetic fields that align in a same direction with respect to each other when high half-select fields are applied to the cell.

7. A magnetic memory device comprising:
a plurality of magnetic memory cells organized into an array of rows and columns, each magnetic memory cell comprising:
a first magnetic layer having a pinned magnetization direction;
a second magnetic layer having a switchable magnetization direction; and
a non-magnetic layer between said first and second magnetic layers;
wherein said cell comprises a hard-axis and an easy-axis, an intersection of the hard-axis and easy-axis defining a center of said cell, and at least said second magnetic layer has a centroid that is displaced along the hard-axis from the center.

8. The magnetic memory device of claim 7 wherein said second magnetic layer is patterned into a lopsided shape that is asymmetrical with respect to the easy-axis and its centroid displaced along the hard-axis from the center.

9. The magnetic memory device of claim 7 wherein each layer has an associated centroid that is displaced from the center along the hard-axis.

10. The magnetic memory device of claim 7 wherein each layer has an associated centroid, is patterned into a lopsided shape that is asymmetrical with respect to the easy-axis, and has its respective centroid displaced along the hard-axis from the center.

11. The magnetic memory device of claim 7 wherein said second magnetic layer comprises first and second end, regions and a main region, said main region being parallel to said easy-axis and stores the magnetization that is switchable between the first and second directions, and said first and second ends store magnetic fields that align in opposite directions with respect to each other when low half-select fields are applied to the cell.

12. The magnetic memory device of claim 7 wherein said second magnetic layer comprises first and second end regions and a main region, said main region being parallel to said easy-axis and stores the magnetization that is switchable between the first and second directions, and said first and second ends store magnetic fields that align in a same direction with respect to each other when high half-select fields are applied to the cell.

13. The magnetic memory device of claim 7, wherein said device is a magnetoresistive random access memory (MRAM) device.

14. A processor system comprising:
a processor; and
a magnetic memory device coupled to said processor, said magnetic memory device comprising a plurality of magnetic memory cells organized into an array of rows and columns, each magnetic memory cell comprising:
a first magnetic layer having a pinned magnetization direction;
a second magnetic layer having a switchable magnetization direction; and
a non-magnetic layer between said first and said second magnetic layers;
wherein said cell comprises a hard-axis and an easy-axis, an intersection of the hard-axis and easy-axis defining a center of said cell, and at least said second magnetic layer has a centroid that is displaced along the hard-axis from the center.

15. The system of claim 14 wherein said second magnetic layer has a lopsided shape that is asymmetrical with respect to the easy-axis and its centroid displaced along the hard-axis from the center.

16. The system of claim 14 wherein each layer has a centroid that is displaced along the hard-axis from the center.

17. The system of claim 14 wherein each layer has a centroid and is patterned into a lopsided shape having its respective centroid displaced from the center along the hard-axis.

18. The system of claim 14 wherein said second magnetic layer comprises first and second end regions and a main region, said main region being parallel to said easy-axis and stores the magnetization that is switchable between the first and second directions, and said first and second ends store magnetic fields that align in opposite directions with respect to each other when low half-select fields are applied to the cell.

19. The system of claim 14 wherein said second magnetic layer comprises first and second end regions and a main region, said main region being parallel to said easy-axis and stores the magnetization that is switchable between the first and second directions, and said first and second ends store magnetic fields that align in a same direction with respect to each other when high half-select fields are applied to the cell.

20. The system of claim 14 wherein said magnetic memory-device is a magnetoresistive random access memory (MRAM) device.

21. The system of claim 14 wherein said magnetic memory device is embedded on a same chip as said processor.

22. A method of storing information in a magnetic memory cell, said method comprises the steps of:
providing a memory cell having a hard-axis and an easy-axis of magnetization, an intersection of the hard-axis and easy-axis defining a center of said cell, the memory cell comprising a magnetic field that is aligned with the easy-axis in a first direction, the memory cell having a centroid that is displaced along the hard-axis from the center;
applying a half-select magnetic field to the cell; and
applying a switching magnetic field to the cell, said switching magnetic field causing the magnetic to switch from the first direction to the second direction.

23. The method of claim 22, wherein a domain wall is formed on the cell before the magnetic field is switched to the second direction.

24. The method of claim 22, wherein the memory comprises a magnetic layer having first and second end regions and a main region, and wherein the value of said half-select field is below a threshold value so as to cause a first magnetic field to be stored in the first end region and a second magnetic field to be stored in the second end region, wherein the first and second magnetic fields are aligned in opposite directions with respect to each other.

25. The method of claim 22, wherein the memory comprises a magnetic layer having first and second end regions and a main region, said method further comprises the step of applying a high half-select field to the cell to cause a first magnetic field to be stored in the first end region and a second magnetic field to be stored in the second end region, wherein the first and second magnetic fields are aligned in a same direction with respect to each other.

* * * * *